United States Patent [19]

Yano et al.

[11] Patent Number: 4,749,665

[45] Date of Patent: Jun. 7, 1988

[54] LOW TEMPERATURE FIRED CERAMICS

[75] Inventors: Shinsuke Yano; Susumu Nishigaki, both of Nagoya, Japan

[73] Assignee: Narumi China Corporation, Nagoya, Japan

[21] Appl. No.: 919,903

[22] Filed: Oct. 16, 1986

[30] Foreign Application Priority Data

Oct. 25, 1985 [JP] Japan ............... 60-237458

[51] Int. Cl.[4] ............... C03C 14/00; C03C 8/14; C03C 8/24
[52] U.S. Cl. ............... 501/32; 501/15; 501/17; 501/65; 501/66; 501/69; 501/70; 501/72
[58] Field of Search ............... 501/5, 8, 9, 15, 17, 501/32, 65, 66, 69, 72, 70

[56] References Cited

U.S. PATENT DOCUMENTS

| | | | |
|---|---|---|---|
| 3,380,838 | 4/1968 | Sack et al. | 501/7 |
| 4,301,324 | 11/1981 | Kumar et al. | 501/7 |
| 4,621,066 | 11/1986 | Nishigaki et al. | 501/128 |

FOREIGN PATENT DOCUMENTS

| | | |
|---|---|---|
| 1082016 | 5/1960 | Fed. Rep. of Germany . |
| 1220094 | 6/1966 | Fed. Rep. of Germany . |
| 50-119814 | 9/1975 | Japan . |
| 54-111517 | 8/1979 | Japan . |
| 58-17695 | 2/1983 | Japan . |
| 883287 | 11/1961 | United Kingdom . |
| 1342823 | 1/1974 | United Kingdom . |

OTHER PUBLICATIONS

Copy of U.S. Ser. No. 449 564, filed Mar. 8, 1974.

*Primary Examiner*—Mark L. Bell
*Attorney, Agent, or Firm*—Flynn, Thiel, Boutell & Tanis

[57] ABSTRACT

Partially crystallized ceramic articles is prepared by firing at low temperatures of 800° to 1100° C., a mixture consisting essentially of, (a) 40 to 50 wt. % of powdered, noncrystalline glass consisting essentially of 10 to 55 wt. % of at least one selected from the group consisting of CaO and MgO, 45 to 70 wt. % of $SiO_2$, 0 to 30 wt. % of $Al_2O_3$, 0 to 30% of $B_2O_3$ and up to 10% impurities, the powder size of said glass being at least 4.0 m$^2$/g in terms of specific surface area measured by the BET Method; and (b) 60 to 50 wt. % of powdered $Al_2O_3$ and the ceramic article is composed essentially of a noncrystallized glass phase, alumina and at least one of crystallized glass phase among anorthite, wollastonite, cordierite and mullite formed by partially crystallizing the glass (a). The ceramic articles exhibit a very high flexural strength well comparable with alumina substrate, together with greatly improved dielectric constant and thermal expansion and thus are especially useful in making multi-layer ceramic substrates for electronic applications.

6 Claims, No Drawings

LOW TEMPERATURE FIRED CERAMICS

BACKGROUND OF THE INVENTION

1. Field of the Invention

The present invention relates to low temperature fired ceramics especially useful in the manufacture of electronic components or parts and further useful in other various application, such as heat-resistance industrial articles, tablewares, kitchen utensiles and decorative articles.

2. Description of the Prior Art

With the increasing trend toward high-speed computers and high-frequency devices or equipments, substrates having a low dielectric constant have been increasingly demanded in place of alumina substrates in current use because the conventional alumina substrates have a large dielectric constant ($\epsilon = 10$) which may cause the delay of signals. Further, the conventional alumina substrates are necessary to be fired at high temperatures and, thus, conductive materials used on the substrates are limited only to high melting point metals, such as Mo or W which may delay signals due to their relatively high electrical resistance.

Under such circumstances, certain ceramic compositions firable at low temperatures of 1100° C. or less have been put into practical use to provide fired ceramics having a low dielectric constant and a thermal expansion coefficient near that of silicon so as to minimize the stress caused due to the difference of thermal expansion between the substrate and large sized silicon chips in view of a LSI chip. Such low temperature ceramic compositions can be co-fired with Au, Ag, Ag-Pd or Cu and thereby allow the use of these low melting point metallic materials as conductor on the ceramics.

For example, the inventors have proposed low-temperature firable ceramic composition comprising CaO-Al$_2$O$_3$-SiO$_2$ (-B$_2$O$_3$) glass and alumina in our previous U.S. patent application, Ser. No. 716,722, filed Mar. 27, 1985, now Patent No. 4,621,066. This ceramic composition develops superior electrical and mechanical properties in the fired products and can be subjected to high speed firing. Since in the course of the firing process, the ceramic composition is partially crystallized, it exhibit a superior ability to prevent deformation of the patterns of conductors and resistors when firing or re-heating treatment.

However, since in the above materials developed by the inventors, an alumina content is limited to a maximum amount of 50%, they have still some problems in their mechanical strength. In order to improve their mechanical strength, it is necessary to increase the use of alumina, and in this invention even if an alumina percentage is increased, it is possible to obtain fully densified fired ceramics.

SUMMARY OF THE INVENTION

It is therefore an object of the present invention to provide low temperature fired ceramics having a superior combination of properties, particularly mechanical strength, desirable dielectric constant and thermal expansion in which alumina can be used in a high content up to 60%, and thereby a greatly increased mechanical strength can be obtained without any detrimental effect on densification.

According to the present invention, there is provided partially crystallized ceramic articles which have been prepared by firing at a low temperature of 800° to 1100° C., a mixture consisting essentially of, in weight percentages:

(a) 40 to 50% of powdered, noncrystalline glass consisting essentially of 10 to 55% of at least one selected from the group consisting of CaO and MgO, 45 to 70% of SiO$_2$, 0 to 30% of Al$_2$O$_3$, 0 to 30% of B$_2$O$_3$ and up to 10% impurities, the powder size of said glass being at least 4.0 m$^2$/g in terms of specific surface area measured by the BET Method; and (b) 60 to 50% of powdered Al$_2$O$_3$.

Specific surface area given in this application refers to values measured by the BET method.

In the present invention a high density fired body can be readily obtained up to the critical maximum amount of alumina of 60% using glass powder of at least 4 m$^2$/g in specific surface area. But any further increased percentage of alumina can not be acceptable for the intended use even if glass powder is more finely divided.

DETAILED DESCRIPTION OF THE PREFERRED EMBODIMENTS

For a better understanding, the present invention will be described in more detail hereinafter. In the specification, percentages refer to percentages by weight, unless otherwise specified.

In the preparation of the ceramics of the present invention, it is desirable that alumina powder to be mixed with the glass powder set forth above has a size of 0.5 $\mu$m or greater, since the use of finer alumina powder than 0.5 $\mu$m make difficult the densification of the resulting fired products.

Since, in the ceramics of the present invention, alumina powder can be used in an increased proportion, strength is significantly increased. For instance, a high flexural strength of about 3000 kg/cm$^2$ which is almost the same level as that of alumina substrates can be developed in the fired ceramics with an alumina content of 55%. Further, despite of an increase in the alumina percentage, firing temperature is not appreciably changed and firing at temperatures of not higher than 1100° C. can be employed.

The low temperature fired ceramics according to the present invention is basically different from the conventional low temperature fired ceramics previously set forth, in behavior or mechanism or process of sintering. The CaO-MgO-Al$_2$O$_3$-SiO$_2$ or CaO-MgO-Al$_2$O$_3$-SiO$_2$-B$_2$O$_3$ system noncrystallized glass employed in the ceramic composition is partially crystallized during the firing step by addition of Al$_2$O$_3$ and precipitates crystals of anorthite, wollastonite, cordierite and/or mullite. Such partial crystallization not only makes possible firing at a lower temperature of 800° to 1100° C. but also minimizes the deformation of fine patterns caused during firing step and makes possible rapid firing.

Further, the ceramic compositions of the present invention are retained in a porous state up to the firing temperatures of 730° to 850° C. without softening and shrinking, even if rapidly heated at a heating rate of the order of more than 30° C./min and thus binders used in the ceramics are readily removed, without any carbon component remaining in the glass phase or the formation of cracks. However, since the ceramics are rapidly shrunk and sintered near the temperature range of 800° to 1100° C., a large-sized, dense ceramic substrate (for example, 30 cm×30 cm in size) can be readily obtained in a shortened firing time. Such rapid sintering ability is believed to be due to the partial crystallization of the low temperature fired ceramics of the present invention and the fact that any shrinkage does not occur due to firing until heated to 730° to 850° C.

The beneficial combination of partial crystallization and rapid shrinkage and sintering at high temperatures are characteristic behaviors in firing step of the mixture of $CaO-MgO-Al_2O_3-SiO_2(-B_2O_3)$ glass and $Al_2O_3$ powder of the present invention. Further, since, up to the temperature of 730° to 850° C., any shrinkage does not occur but, thereafter, at the final firing stage at higher temperature, partial crystallization rapidly takes place, flowing of glass is prevented and thereby fine patterns with a high precision can be readily obtained without causing any deformation. Therefore, the green ceramics multilayered, conductors, resistors, capacitors are simultaneously fired with a high precision configuration. Further, in addition to the advantage that the simultaneous firing can be performed without causing any deformation of patterns, $RuO_2$ resistor, Cu conductors or the like can be applied onto the fired ceramic substrate by conventional thick film printing techniques and fired without accompanying deformation of the multilayer ceramic structure or the circuit patterns previously fired onto the substrate by the simultaneous firing, by virtue of the partial crystallization caused by firing at 800° to 1100° C.

In the present invention, glass powder size is given in terms of specific surface area measured by the BET method. This is ascribable to the fact that since glass powder can not be successfully dispersed in a liquid, its particle size can not be correctly measured by using a usual measuring apparatus and it is difficult to define glass powder size in other terms.

The reason why the glass powder used as a starting material is limited to the composition specified above is as follows.

When the $SiO_2$ content is less than 45%, dielectric constant and thermal expansion coefficient will be increased to an undesirable level and precipitates of anorthite, cordierite, wollastonite and/or mullite will not be given in enough amounts from partial crystallization and, deformation of conductor or resistor patterns formed on a ceramic substrate is apt to occur during the firing or re-heating process. On the other hand, an excess use of $SiO_2$ exceeding 70% make difficult the low temperature firing at 1100° C. or lower.

When $Al_2O_3$ is employed in an amount more than 30%, firing at 1100° C. or lower becomes difficult.

CaO and MgO is contained in the glass solely or in combination thereof in a total amount 10 to 55%. The content of CaO and/or MgO in an amount less than 10%, will make impossible firing at temperatures of 1100° C. or lower. While an excess amount of CaO and/or MgO exceeding 55% results in an unfavorable increase in dielectric constant and thermal expansion coefficient. The use of MgO will gives smaller dielectric constant and thermal expansion than the use of CaO. The content of CaO and/or MgO exceeding 55% can not provide enough amounts of cordierite and mullite which may be precipitated from partial crystallization.

$B_2O_3$ not only makes it possible to melt glass-forming materials near temperatures of about 1300° to 1450° C., but also has an effect in lowering the firing temperature of the ceramics to 1100° C. or lower without changing their electrical properties and mechanical or physical properties. An amount of $B_2O_3$ exceeding 30% leads to a deleterious reduction in flexural strength and moisture-resistance, thereby lowering reliability, although increasing a $B_2O_3$ content tends to cause the lowering of dielectric constant and thermal expansion coefficient.

The glass may contain up to 5% alkali metal oxide(s) of $Na_2O$ and/or $K_2O$. These alkali metal oxides may be present as an impurity in a glass-forming material or are added for the purpose of promoting the melting of the glass-forming material at the step of forming a glass. However, an amount of these oxides exceeding 5% is unfavorable, because such an excess amount will deteriorate electrical properties and moisture-resistance and thereby reliability will be lowered.

The glass may also contain, as further impurities, BaO, PbO, $Fe_2O_3$, $MnO_2$, $Mn_3O_4$, $Cr_2O_3$, NiO, $Co_2O_3$, etc., in a total amount (containing the amount of the foregoing alkali metal oxides, if present) up to 10% without impairing the properties of the ceramics. Further, although, on the firing process of the raw material composed of the glass and alumina, partial crystallization can take place without requiring the addition of special nucleating agent to the glass, the impurities may accelerate the crystallization in certain situations.

In certain applications where high reliability is required under conditions of high temperature and high humidity, it is desirable that Pb be excluded.

The fired ceramics prepared by firing the powder mixture consisting of 40 to 50% of the glass powder with the composition specified above and 50 to 60% of alumina powder have the composition consisting of, in weight percentages, 50 to 72% of $Al_2O_3$, 18 to 35% of $SiO_2$, 4 - 27.5% of at least one selected from the group of CaO and MgO, 0 to 15% of $B_2O_3$ and impurities total up to 10% and is composed essentially of a noncrystallized glass phase, alumina and at least one of crystallized glass phase among anorthite, wollastonite, cordierite and mullite formed by partially crystallizing said glass. In a preferred embodiment, the powdered, noncrystalline glass consists essentially of 21.1 to 27.3% of CaO, 0 to 0.06% of MgO, 50 to 59.1% of $SiO_2$; 4.5 to 14.3% of $Al_2O_3$ and 8.2 to 9.1% of $B_2O_3$.

In preparing the ceramics of the present invention, CaO (and/or MgO), $SiO_2$, $Al_2O_3$ and $B_2O_3$ or precursors thereof are thoroughly admixed as glass-forming materials in so as to yield the glass composition set forth above, melted at a temperature of 1300° to 1450° C. and then quenched to provide the glass. The starting materials employed in making the glass may be in any form of carbonates, oxides or hydroxide. The heating temperature of 1300° to 1450° C. is a desirable range from the viewpoint of materials used in a furnace, etc.

Powders of the thus obtained glass and alumina are mixed in the given proportion and then formed in a usual ceramic-forming manner, such as cold pressing or tape casting operation. Thereafter, the formed material is fired at temperatures of 800° to 1100° C.

In the application where the ceramic composition of the present invention is used to make multilayer substrates, for example, Ag conductors are printed onto the green ceramic sheets, the required number of the sheets are stacked, hot-pressed and then co-fired into a integrated multilayer structure. As necessary interconnection holes are formed.

In other applications, resistor pastes, for example $RuO_2$ or SiC resistor paste, or capacitor pastes, such as $BaTiO_3$, $SrTiO_3$, $Pb(Fe_{2/3}W_{1/3})O_3$ - $Pb(Fe_{1/2}Nb_{1/2})O_3$, are printed onto the green ceramic sheets and then the sheets are stacked, hot-pressed and fired at the same time to form a integrated laminated substrate incorporating resistors or capacitors. If desired, green ceramic sheets consisting of capacitor compositions may be stacked onto the invention green ceramic sheets, hot-pressed and simultaneously fired to provide integrated structures incorporating capacitors therein.

Also, a conductor paste comprising copper powder having a controlled particle size which has been subjected to an antioxidation treatment is printed onto the green sheets and the green sheets are laminated into a multilayer structure. The green sheets thus laminated are co-fired in an inert atmosphere consisting mainly of nitrogen gas to provide a low-temperature co-fired multilayer substrate having Cu conductors therein. Also, in such an inert atmosphere of nitrogen, there can be prepared a multilayered substrate assembly containing in addition to the Cu conductors, resistors using resistor pastes containing metal(s) or metallic compound(s), such as Ni - Cr, molybdenum silicide, W - Ni, etc.

Now, the present invention will be described in detail with reference to the detailed examples which follow.

EXAMPLES $CaCO_3$, $Mg(OH)_2$, $Al_2O_3$, $SiO_2$ and $H_3BO_3$ were weighed as starting materials for glass in the percentages given in Table 1 below and were thoroughly mixed by using a mill to provide each powder mixture. Then, the powder mixture was melted at 1400° C. and poured in water to yield a glass.

The glass thus obtained was placed in an alumina pot, together with water and alumina balls, was wetmilled and was dried to yield glass powder having a specific surface area of 4.5 m²/g.

The glass powders obtained above were blended with alumina powder in the proportions shown in Table 1, i.e., 45% of glass and 55% of alumina or 40% of glass and 60% of alumina. Each powder mixture was placed in an alumina pot with water and alumina balls, then milled for 3 hours and dried.

100 g of methacryl type binder, 50 g of plasticizer (dioctyl adipate) and 400 g of solvent (toluene and xylene) were added to 1000 g of each of the above powder mixtures and formed into a slip. The slip was formed into a 1.0 mm thick green sheet using a doctor blade and fired at a temperature of 850° to 1000° C., thereby obtaining a fired ceramic. The fired ceramics were each tested on their physical properties.

Examples 1 to 5 given in Table 1 show the relation between physical properties and composition and the fired ceramics thus obtained exhibited a very high degree of flexural strength of 2600 to 3200 kg/cm² which are well comparable with that of an alumina substrate.

TABLE 1

| | Example No. | | | | |
|---|---|---|---|---|---|
| | 1 | 2 | 3 | 4 | 5 |
| Glass Composition (wt. %) | | | | | |
| $SiO_2$ | 50 | 54.1 | 54.4 | 51.7 | 59.1 |
| $Al_2O_3$ | 13.61 | 11.9 | 14.3 | 15 | 4.5 |
| CaO | 27.3 | 21.1 | 22.4 | — | 27.3 |
| MgO | — | — | 0.6 | 16.7 | — |
| $B_2O_3$ | 9.1 | 8.3 | 8.2 | 16.7 | 9.1 |
| $Na_2O + K_2O$ | <0.1 | 1.8 | 0.7 | <0.1 | <0.1 |
| Other Impurities | — | $MnO_2$ 2.8 | — | — | — |
| Glass/Alumina Weight Ratio | 40/60 | 45/55 | 45/55 | 45/55 | 45/55 |
| Firing Temperature (°C.) | 900 | 900 | 900 | 1000 | 900 |
| Properties of Ceramics | | | | | |

TABLE 1-continued

| | Example No. | | | | |
|---|---|---|---|---|---|
| | 1 | 2 | 3 | 4 | 5 |
| Bulk Density (g/cc) | 3.2 | 3.2 | 3.1 | 3.0 | 3.2 |
| Flexural Strength (kg/cm²) | 2600 | 3100 | 3200 | 2700 | 3000 |
| Thermal Exp. Coeff. × $10^{-6}$/°C.*1 | 5.4 | 5.7 | 5.5 | 4.0 | 5.5 |
| Dielectric Constant at 1 MHz | 8.6 | 8.3 | 8.2 | 6.5 | 8.4 |
| tan δ × $10^{-4}$ at 1 MHz | 2 | 5 | 7 | 6 | 5 |
| Volume Resistivity (cm · Ω) | >$10^{14}$ | >$10^{14}$ | >$10^{14}$ | >$10^{14}$ | >$10^{14}$ |

*1measured at the temperature range from room temperature to 250° C.

COMPARATIVE EXAMPLES

Fired ceramics of comparative Examples 1 to 4 given in Table 2 were obtained in the same way as described in the foregoing Examples using the 60% of the glass powders used in Examples and 40% of alumina powder. The glasses used in comparative Examples 1 to 4 were the same as those of the foregoing Examples 1 to 4, respectively.

The flexural strength of these comparative ceramics was only the order of 1800 to 2100 kg/cm².

Also, in comparative Examples 5 to 8 given in Table 2, further comparative ceramics were provided in the same procedure described in Examples 1 to 4, using 45% of glass powder with a specific surface area of 3 m²/g and 55% of alumina powder and their flexural strength are shown in Table 2. The glass employed in Comparative Examples 5 to 8 had the same compositions as those of Examples 1 to 4, respectively. The flexural strength of these comparative ceramics was only the order of 2000 to 2200 kg/cm² because they were not fully densified.

TABLE 2

| Comparative Example No. | 1 | 2 | 3 | 4 |
|---|---|---|---|---|
| Glass/Alumina Weight Ratio | 60/40 | 60/40 | 60/40 | 60/40 |
| Bulk Density (g/cc) | 3 | 3 | 3 | 2.8 |
| Flexural Strength (kg/cm²) | 1900 | 2100 | 2000 | 1800 |

| Comparative Example No. | 5 | 6 | 7 | 8 |
|---|---|---|---|---|
| Glass/Alumina Weight Ratio | 45/55 | 45/55 | 45/55 | 45/55 |
| Bulk Density (g/cc) | 2.9 | 2.8 | 2.9 | 2.7 |
| Flexural Strength (kg/cm²) | 2000 | 2200 | 2100 | 2000 |

As described above, the fired ceramics of the present invention can be obtained by firing at the lower temperature order of 1100° C. or lower and possess a high degree of flexural strength well comparable with that of alumina substrates heretofore used. Therefore, the present invention can provide the fired ceramics having improved dielectric constant and thermal expansion in comparison with known alumina substrates, without lowering their strength. Further, due to such a low firing temperature, low electrical resistance metallic materials, such as Au, Ag, Ag-Pd, can be used as conductors without causing deformation of conductor patterns.

What is claimed is:

1. A partially crystallized ceramic article which has been prepared by firing at a temperature of 800° to 1100° C., a mixture consisting essentially of, in weight percentages:
(a) 40 to less than 50% of powdered, noncrystalline glass consisting essentially of 10 to 55% of at least one material selected from the group consisting of CaO and MgO, 45 to 70% of $SiO_2$, 0 to 30% of $Al_2O_3$, 0 to 30% of $B_2O_3$ and up to 10% impurities, the powder size of said glass being at least 4.0 $m^2/g$ in terms of specific surface area measured by the BET Method; and
(b) 60 to more than 50% of powdered $Al_2O_3$.

2. A paritally crystallized ceramic article as claimed in claim 1 which consists essentially of a noncrystallized glass phase, alumina and at least one of crystallized glass phase selected from the group consisting of anorthite, wollastonite, cordierite and mullite formed by partially crystallizing said glass (a).

3. A partially crystallized ceramic article as claimed in claim 1 in which said glass (a) was prepared by melting CaO, MgO, $SiO_2$ and $Al_2O_3$, or their corresponding carbonates or hydroxides, at a temperature of 1300° to 1450° C. to form molten glass, then pouring the molten glass into water to obtain glass frit and then milling the glass frit to obtain the glass (a).

4. A partially crystallized ceramic article as claimed in claim 1 in which said powdered, noncrystalline glass consists essentially of 21.1 to 27.3% of CaO,
0 to 0.6% of MgO,
50 to 59.1% of $SiO_2$,
4.5 to 14.3% of $Al_2O_3$, and
8.2 to 9.1% of $B_2O_3$.

5. A partially crystallized ceramic article which has been prepared by firing at a temperature of 800° to 1100° C., a mixture consisting essentially of, in weight percentages:
(a) 40 to less than 50% of powdered, noncrystalline glass consisting essentially of
10 to 55% of MgO,
45 to 70% of $SiO_2$,
0 to 30% of $Al_2O_3$,
0 to 30% of $B_2O_3$ and
up to 10% impurities,
the powder size of said glass being at least 4.0 $m^2/g$ in terms of specific surface area measured by the BET Method; and
(b) 60 to more than 50% of powdered $Al_2O_3$.

6. A partially crystallized ceramic article as claimed in claim 5 in which said powdered, noncrystalline glass consists essentially of
51.7% $SiO_2$,
15% $Al_2O_3$,
16.7% MgO and
16.7% $B_2O_3$.

* * * * *